(12) United States Patent
Morita et al.

(10) Patent No.: US 7,875,882 B2
(45) Date of Patent: Jan. 25, 2011

(54) ORGANIC LUMINESCENT DISPLAY DEVICE HAVING A SEMICONDUCTOR WITH AN AMORPHOUS SILICON LAYER

(75) Inventors: Satoshi Morita, Tottori (JP); Shinichiro Tanaka, Tottori (JP); Osamu Kobayashi, Tottori (JP)

(73) Assignees: Sanyo Electric Co., Ltd., Osaka (JP); Tottori Sanyo Electric Co., Ltd, Tottori (JP)

( * ) Notice: Subject to any disclaimer, the term of this patent is extended or adjusted under 35 U.S.C. 154(b) by 0 days.

(21) Appl. No.: 12/354,340

(22) Filed: Jan. 15, 2009

(65) Prior Publication Data

US 2009/0127559 A1 May 21, 2009

Related U.S. Application Data

(62) Division of application No. 10/500,143, filed as application No. PCT/JP03/05222 on Apr. 23, 2003, now Pat. No. 7,488,972.

(30) Foreign Application Priority Data

| Apr. 26, 2002 | (JP) | ............................. 2002-125592 |
| May 31, 2002 | (JP) | ............................. 2002-159124 |
| Jun. 14, 2002 | (JP) | ............................. 2002-173816 |
| Jun. 14, 2002 | (JP) | ............................. 2002-173817 |

(51) Int. Cl.
H01L 51/00 (2006.01)

(52) U.S. Cl. ............................. 257/40; 257/79; 257/88; 257/90; 257/91; 257/92; 257/93

(58) Field of Classification Search .................. 257/40, 257/79, 88, 90, 91, 92, 93
See application file for complete search history.

(56) References Cited

U.S. PATENT DOCUMENTS 5,808,317 A 9/1998 Kuo (Continued)

FOREIGN PATENT DOCUMENTS

CN 1322015 11/2001

(Continued)

*Primary Examiner*—Long Pham
(74) *Attorney, Agent, or Firm*—Arent Fox, LLP

(57) ABSTRACT

A display device includes a plurality of light emitting elements arranged in a matrix. A scan signal is made to flow into a gate signal line and a data signal is made to flow into a source signal line so that the data signal is applied to a source electrode and the scan signal is supplied to a gate electrode of a control TFT arranged at a portion where the both signal lines intersect when viewed from above. Thus, when the control TFT is turned ON, a drive TFT having a gate electrode connected to the drain electrode is turned ON, so that current is supplied from a power supply line via the source electrode and the drain electrode of the drive TFT to an organic EL element and the organic EL element emits light. A holding capacity is present between the control TFT and the drive TFT. Even when the scan signal becomes LOW level and the control TFT turns OFF, the gate potential of the drive TFT is held for a predetermined period of time by the holding capacity and the organic EL element continues to emit light.

15 Claims, 6 Drawing Sheets

U.S. PATENT DOCUMENTS

| | | |
|---|---|---|
| 6,350,996 B1 | 2/2002 | Kawai et al. |
| 7,488,972 B2 * | 2/2009 | Morita et al. ............... 257/40 |
| 2001/0054998 A1 | 12/2001 | Yeo et al. |
| 2002/0021268 A1 | 2/2002 | Yamazaki et al. |
| 2002/0047120 A1 | 4/2002 | Inukai |
| 2002/0145144 A1 | 10/2002 | Kane et al. |
| 2005/0007331 A1 | 1/2005 | Yamazaki et al. |

FOREIGN PATENT DOCUMENTS

| | | |
|---|---|---|
| EP | 0 862 156 A1 | 9/1998 |
| EP | 0 942 407 A1 | 9/1999 |
| EP | 1 326 281 A1 | 7/2003 |
| FR | 2 599 559 A1 | 12/1987 |
| JP | 10-161564 | 6/1998 |
| JP | 10-162058 | 6/1998 |
| JP | 2000-228284 | 8/2000 |
| WO | WO 02/31887 A1 | 4/2002 |

* cited by examiner

ORGANIC LUMINESCENT DISPLAY DEVICE HAVING A SEMICONDUCTOR WITH AN AMORPHOUS SILICON LAYER

CROSS REFERENCE AND RELATED INFORMATION

This application is a divisional of U.S. application Ser. No. 10/500,143, filed Jul. 8, 2004, which is a 371 of PCT/JP03/05222, filed Apr. 23, 2003, and is based upon and claims the benefit of priority from Japanese applications 2002-173816, filed Jun. 14, 2002, 2002-173817, filed Jun. 14, 2002, 2002-125592, filed Apr. 26, 2002 and 2002-159124 filed May 31, 2002, the entire contents of which are incorporated herein by reference.

TECHNICAL FIELD

The present invention relates to a display device having light-emitting elements arrayed in a matrix-like pattern.

BACKGROUND ART

Nowadays, LCDs are widely used as flat panel displays in various appliances ranging from cellular phones to large-screen television monitors. However, since LCDs are not self-illuminating, they suffer from narrow viewing angles, and require a light source such as a backlight, which makes it impossible to reduce power consumption beyond a certain limit. To avoid these inconveniences, as alternatives to LCDs, self-illuminating display devices exploiting, for example, organic electroluminescence (hereinafter referred to as organic EL) are being studied.

This type of display device has, as pixels, organic EL elements arranged in a matrix-like pattern, and achieves image display by driving those organic EL elements to emit light individually. In a case where they are driven by an active matrix method, a thin-film transistor (hereinafter referred to as TFT) is formed in each pixel so that each pixel can be driven independently. This makes it possible to obtain high-definition, high-brightness display. In addition, it is also possible to obtain high-efficient light emission characteristics and thereby reduce power consumption. In this type of display device, for each pixel, there are provided an organic EL element that is composed of a light-emitting layer sandwiched between two electrodes, a drive TFT that feeds a current to one of the electrodes of the organic EL element, and a control TFT that controls the operation of the drive TFT. Typically, these drive and control TFTs are formed as polysilicon TFTs having a polycrystalline active layer.

Inconveniently, however, with the drive and control TFTs formed as polysilicon TFTs, the display device needs to be fabricated through a complicated, difficult fabrication process, and requires sophisticated fabrication technology and expensive fabrication equipment. This makes the display device as an end product accordingly expensive. Moreover, since it is difficult to make the active layer uniformly polycrystalline, it is difficult to fabricate large-area TFTs with uniform characteristics. This makes it difficult to fabricate a large-screen display device.

DISCLOSURE OF THE INVENTION

An object of the present invention is to provide a self-illuminating display device that permits easy fabrication of TFTs and that is suited for large-screen applications.

To achieve the above object, according to the present invention, in a display device having a plurality of pixels arrayed so as to form a matrix-like pattern, the display device comprises a light-emitting element that is formed in each pixel, a drive TFT that is formed in each pixel and that feeds a current to the light-emitting element to make the light-emitting element emit light, and a control TFT that controls the operation of the drive TFT. Here, the drive TFT and the control TFT have a semiconductor layer formed of amorphous silicon.

According to the present invention, in the display device described above, the light-emitting element is formed in a longitudinally oblong shape, and the drive TFT is formed in a laterally oblong shape and is arranged with the length direction thereof perpendicular to the length direction of the light-emitting element.

According to the present invention, in the display device described above, the light-emitting element is formed in a longitudinally oblong shape, the drive thin-film transistor is formed in a laterally oblong shape, a gate signal line and a source signal line connecting to the control thin-film transistor are arranged so as to form a grid-like pattern, the light-emitting element is arranged with the length direction thereof parallel to the source signal line, and the drive thin-film transistor is arranged with the length direction thereof parallel to the gate signal line.

According to the present invention, in the display device described above, the drive thin-film transistor has a channel region formed in an elongate shape and is arranged with the length direction of the channel region thereof parallel to the gate signal line.

According to the present invention, in the display device described above, of the source electrode and the drain electrode of the drive TFT, one is formed in a rectilinear shape and the other is formed in a shape surrounding the one.

According to the present invention, in the display device described above, the drive TFT has a U-shaped source electrode and a drain electrode located between two fork-like portions of the U-shaped source electrode.

According to the present invention, in the display device described above, for each row of the matrix-like pattern are formed a gate signal line that is connected to the gate electrodes of all the control thin-film transistors in the pixels located in the row and a power feed line from which a current is fed via the drive thin-film transistors to the light-emitting elements in the row, for each column of the matrix-like pattern is formed a source signal line that is connected to the source electrodes of all the control thin-film transistors in the pixels located in the column and that crosses the gate signal line, and within each area surrounded by gate signal lines and source signal lines, the light-emitting element, the drive TFT, the power feed line, and the control TFT are arranged in this order along the source signal line as seen in a plan view.

According to the present invention, in the display device described above, between the drive TFT and the control TFT is formed a holding capacitor of which one electrode is shared as the power feed line and of which the other electrode is formed by an auxiliary electrode that connects to the drain electrode of the control TFT, and the auxiliary electrode is electrically connected to the gate electrode of the drive TFT.

According to the present invention, in the display device described above, the display device comprises light-emitting elements that emit light of different colors, a plurality of power feed lines are formed so as to correspond to light of the different colors, the plurality of power feed lines are arranged between the drive thin-film transistor and the control thin-film transistor, and the light-emitting elements are fed with a current from the corresponding power feed lines.

According to the present invention, in the display device described above, the gate signal line is used as the gate electrode of the control TFT, and the control TFT is formed above the gate signal line.

According to the present invention, in the display device described above, a bank layer is arranged around the light-emitting element, the bank layer is formed so as to overlap the drive TFT, a cut is formed in the bank layer between the light-emitting element and the drive TFT, and a light-shielding film is formed on the bank layer at least in a portion thereof near the cut.

According to the present invention, in the display device described above, a bank layer is arranged around the light-emitting element, the bank layer is formed so as to overlap the control TFT, a cut is formed in the bank layer between the light-emitting element and the control TFT formed in the next pixel, and a light-shielding film is formed on the bank layer at least in a portion thereof near the cut.

According to the present invention, in the display device described above, a bank layer is formed so as to cover the drive thin-film transistor and the control thin-film transistor, the bank layer has edges thereof located between the drive and control thin-film transistors and the light-emitting element, and a light-shielding film is formed on the bank layer.

According to the present invention, in the display device described above, the display device further comprises a pixel electrode that is arranged below a light-emitting layer of the light-emitting element and that connects to the drive TFT and a common electrode that is arranged so as to face the pixel electrode with the light-emitting layer interposed in between and that covers the bank layer, and the light-shielding film is formed by the common electrode.

According to the present invention, in the display device described above, the drive TFT and the control TFT are of an n-channel type.

According to the present invention, in the display device described above, the drive TFT and the control TFT are of a p-channel type.

According to the present invention, in the display device described above, the light-emitting element is of an organic electroluminescence type.

BEST MODE FOR CARRYING OUT THE INVENTION

Figure 1:
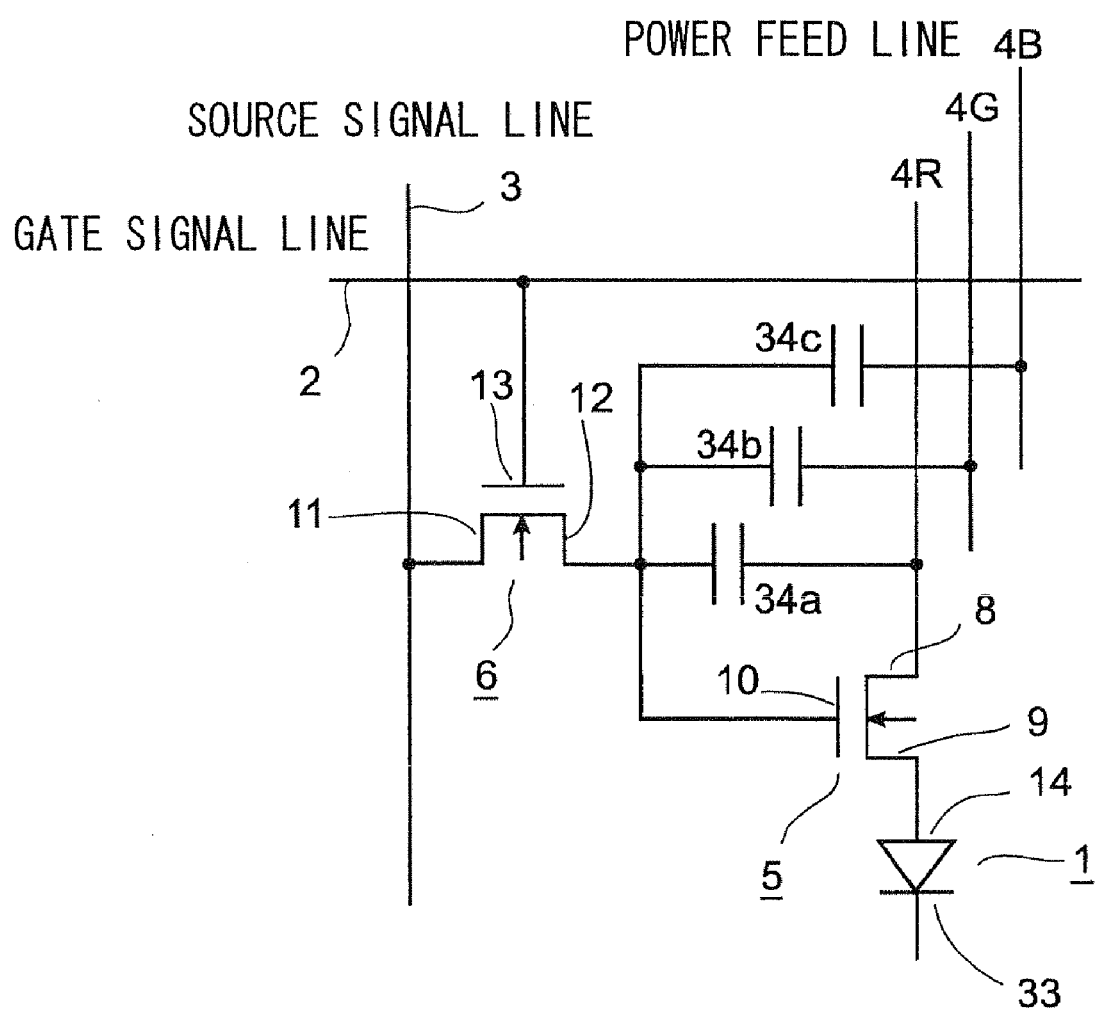
FIG. 1 is a circuit diagram of each pixel of a display device embodying the invention.
Figure 2:
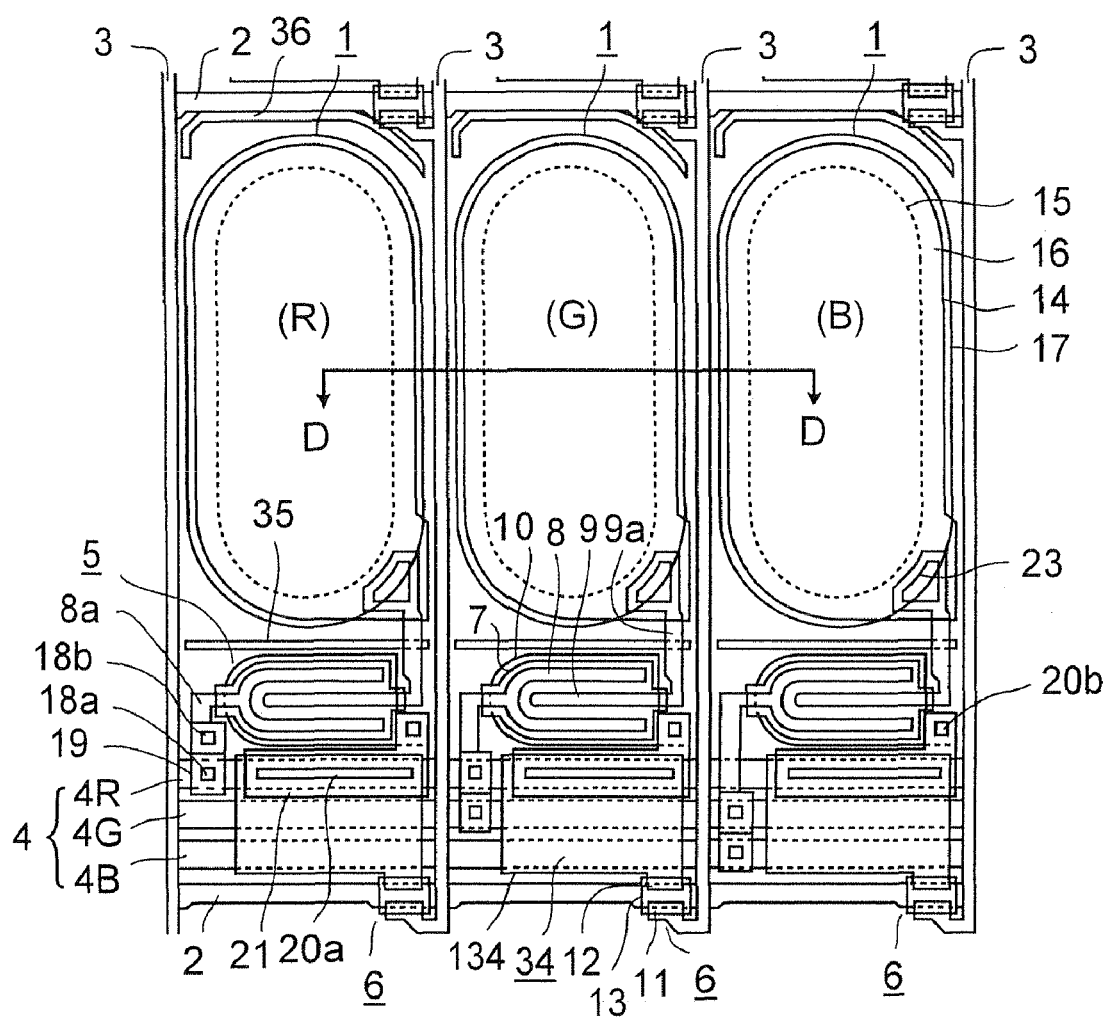
FIG. 2 is a plan view showing pixels of the display device of the invention and a portion around it.
Figure 3:
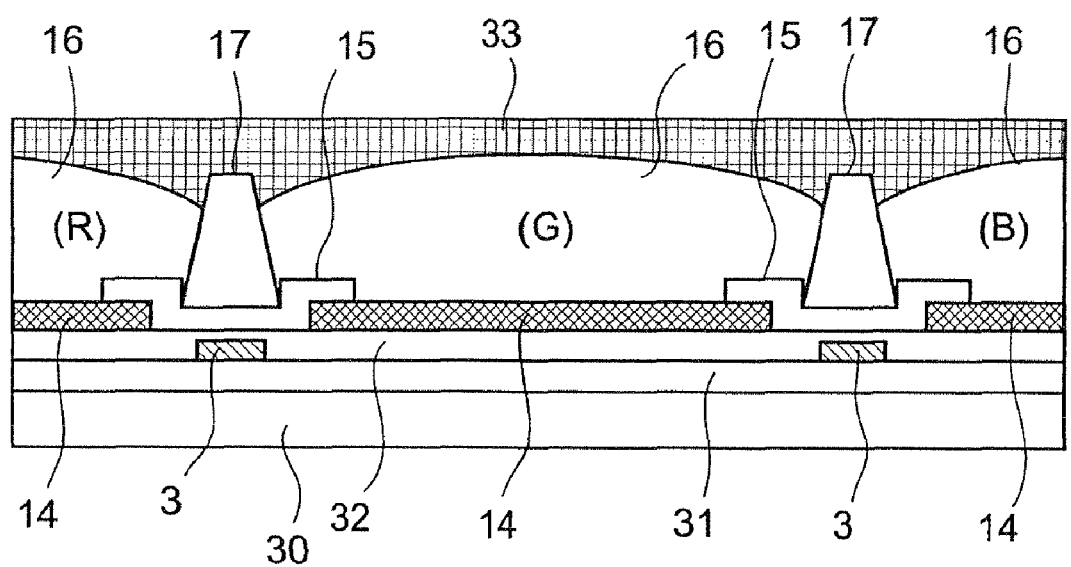
FIG. 3 is a schematic cross-sectional view of the light-emitting element formed within a pixel.

Hereinafter, an embodiment of the present invention will be described with reference to the drawings. FIG. 1 is a diagram schematically showing the circuit configuration of a pixel in a display device according to the invention. FIG. 2 is a plan view showing pixels of the display device and a portion around it. FIG. 3 is a schematic cross-sectional view (taken along line D-D shown in FIG. 2) of the light-emitting element formed within the pixel. In this embodiment, the light-emitting element is realized with an organic EL element 1. It should be noted that, while a common electrode 33 is shown in FIG. 3, it is omitted in FIG. 2 to make the figure easy to view.

As shown in FIG. 1, the organic EL element 1 emits light when a current flows therethrough from a pixel electrode 14 to a common electrode 33, and its brightness can be adjusted by controlling the level of the current. The organic EL element 1 of a particular pixel is made to emit light in the following manner. A scanning signal is fed to a gate signal line 2, and a data signal is fed to a source signal line 3. At the intersection between the two signal lines as seen in a plan view, there is formed a control TFT 6 as a second transistor, so that the data signal and the scanning signal are fed to the source electrode 11 and the gate electrode 13, respectively, of the control TFT 6. When the control TFT 6 is turned on in this way, a drive TFT 5 formed as a first transistor and having the gate electrode 10 thereof connected to the drain electrode 12 of the control TFT 6 is turned on. Thus, a current is fed from a power feed line 4 through the source electrode 8 and the drain electrode 9 of the drive TFT 5 to the organic EL element 1, causing it to emit light. Between the control TFT 6 and the drive TFT 5, there exists a holding capacitor 34, of which one electrode is formed by the power feed line 4, and of which the other electrode is formed by an auxiliary electrode that is formed simultaneously with the drain electrode 12. Thus, when the scanning signal turns low and accordingly the control TFT 6 is turned off, the gate potential of the drive TFT 5 is maintained by the holding capacitor 34, permitting the organic EL element 1 to keep emitting light.

Next, the structure of the display device of the invention will be described with reference to FIGS. 2 and 3. In the display area of the display device, gate signal lines 2 and source signal lines 3 are laid so as to form a grid-like pattern, and pixels are formed individually in the areas surrounded by the gate signal lines 2 and the source signal lines 3. In each pixel, there is formed an organic EL element 1 exploiting organic EL as the light-emitting layer 16, and, along with this organic EL element 1, there are formed a drive TFT 5 that feeds a current from a power feed line 4 to the organic EL element 1 and a control TFT 6 that controls the drive TFT 5 by turning it on and off. When a current is fed from a power feed line 4 to an organic EL element 1, the light-emitting layer 16 thereof emits light of a given color, and its brightness can be adjusted by controlling the level of the current.

On a glass substrate 30, a plurality of gate signal lines 2 are laid parallel to one another, and, along each gate signal line 2, three power feed lines 4 are laid. The gate signal lines 2 and the power feed lines 4 are formed simultaneously in a single fabrication step, and are formed of Al or Cr. The three power feed lines 4 are for R, G, and B colors, respectively, and accordingly the power feed line 4R for the R color is connected to an organic EL element 1 having a red light-emitting layer 16(R), the power feed line 4G for the G color is connected to an organic EL element 1 having a green light-emitting layer 16(G), and the power feed line 4B for the B color is connected to an organic EL element 1 having a blue light-emitting layer 16(B). Organic EL elements 1 having different light-emitting materials emit light of different colors, and emit light with different light emission efficiency. Thus, by forming different power feed lines 4 for different colors so as to feed appropriate levels of current for the different colors, it is possible to achieve optimum full-color display.

When the gate signal line 2 and the power feed lines 4 are formed, the gate electrode 10 of the drive TFT 5 is formed simultaneously between the power feed lines 4 and the organic EL element 1. This gate electrode 10 is formed in a laterally oblong shape along the power feed lines 4, and has one of the shorter sides thereof formed in a rectilinear shape and the other in an arc shape. Since the drive TFT 5 serves to feed a current to the organic EL element 1, as much current as possible needs to be passed through the drive TFT 5 when it is on, and accordingly its gate electrode 10 is formed as large as possible.

On top of the glass substrate 30, there is laid a gate insulating film 31 formed of SiNx (silicon nitride film), and this gate insulating film 31 covers the gate signal line 2 and the power feed lines 4. On top of the gate insulating film 31, there is laid an amorphous silicon layer (hereinafter referred to as the a-Si layer), of which unnecessary parts are then removed by photolithography so as to leave only those portions thereof which correspond to the semiconductor layers (active layers) 7 and 13 of the TFTs 5 and 6. Here, the a-Si layer patch 7 left in the drive TFT 5 has a shape whose contour runs along the outer edge of the gate electrode 10, and lies over the greater part of the gate electrode 10, protruding out of it in the shorter-side and arc-shaped portions thereof. On the other hand, the a-Si layer patch 13 left in the control TFT 6 has a rectangular shape, and lies across the gate signal line 2.

On top of the a-Si layer patches 7 and 13 and the gate insulating film 31, there is formed a metal layer having layers of Al and Mo laid on one another, and then this metal layer is patterned by photolithography to form the source signal line 3, the source and drain electrodes of the TFTs 5 and 6, and other elements. Here, the source signal line 3 is formed perpendicular to the gate signal line 2, with the source electrode 11 protruding from the source signal line 3, near the intersection between the source and gate signal lines 3 and 2, so as to reach above the a-Si layer patch 13 of the control TFT 6. The drain electrode 12 of the control TFT 6 connects to the gate electrode 10 of the drive TFT 5 via an auxiliary electrode 134 and a transparent electrode 21, which will be described later. Thus, when the control TFT 6 is turned on, it feeds the current flowing through the source signal line 3 to the gate electrode 10 of the drive TFT 5. The auxiliary electrode 134, which connects to the drain electrode 12 of the control TFT 6, covers the power feed lines 4 with the gate insulating film 31 laid in between, and the power feed lines 4 and the auxiliary electrode 134 together form the holding capacitor 34. In a-Si TFTs, the gate insulating film 31 is significantly thicker than in polysilicon TFTs, and this makes the capacitance of the holding capacitor 34 low. To avoid shortage of capacitance here, the auxiliary electrode 134 is required to cover as wide an area as possible over the power feed lines 4, and therefore the auxiliary electrode 134 is formed so as to cover the greater part of the power feed lines 4 within each pixel.

Within the drive TFT 5, there are formed a substantially U-shaped source electrode 8 and a substantially rectilinear drain electrode 9 located between the two fork-like portions of the source electrode 8. From an outer-edge portion of the source electrode 8 facing away from the drain electrode 9 protrudes an electrode 8a that reach near the power feed lines 4 so as to be connected, via a transparent electrode 19, which will be described later, to whichever of the power feed lines 4 corresponds to the color of the pixel. On the other hand, from the drain electrode 9 protrudes an electrode 9a that, just outside the a-Si layer patch 7, turns toward the organic EL element 1 so as to reach and electrically connected to the pixel electrode 14 of the organic EL element 1.

The outer edge of the source electrode 8 of the drive TFT 5 is so shaped as to run along the outer edge of the gate electrode 10, and the two fork-like portions of the U shape are formed as long as possible above the gate electrode 10. The drain electrode 9 is formed elongate so as to be shaped like the two fork-like portions of the source electrode 8. The drive TFT 5 serves to feed a current from the power feed line 4 to the pixel electrode 14, and therefore as much current as possible needs to be passed through the drive TFT 5 when it is on. A a-Si TFT is more difficult for a current to pass through than a polysilicon TFT. Accordingly, when an a-Si TFT is used as the drive TFT 5, the drive TFT 5 needs to be formed as large as possible. Specifically, more current can be passed by reducing the channel length and increasing the channel width. However, since it is technically infeasible to reduce the channel length over a certain limit, an effective way here is to form the drive TFT 5 as large as possible so as to increase the channel width. Accordingly, in this embodiment, the shapes of the source and drain electrodes 8 and 9 are so designed that the drive TFT 5 permits as much current as possible to pass therethrough. Specifically, the gate electrode 10 of the drive TFT 5 is formed in a laterally oblong shape, and the source and drain electrodes 8 and 9 are formed elongate. This makes it possible to secure a large channel width within a limited space. In particular, forming the laterally oblong gate electrode 10 with its length direction parallel to the gate signal line 2 makes it possible to form the drive TFT 5 over the entire interval between adjacent source signal lines 3. Moreover, aligning the direction of the channel width parallel to the gate signal line 2 makes it possible to effectively increase the channel width within the limited size of the drive TFT 5. Furthermore, forming the source electrode 8 in a U shape and arranging the drain electrode 9 between the two fork-like portions of the U shape permits the source electrode 8 to be located on both sides of the drain electrode 9 and thus helps double the channel width. This makes it possible to effectively obtain a large channel width within a small space.

The control TFT 6 simply serves to control the drive TFT by turning it on and off, and therefore, as opposed to the drive TFT 5, less voltage needs to be passed through the control TFT 6. This permits the control TFT 6 to be formed in an accordingly small size. Making the control TFT 6 smaller helps secure an accordingly large space for the drive TFT 5, and thus helps make the TFT 5 larger. Hence, a branch of the source signal line 3 is formed that diverges therefrom near the intersection between the gate signal line 2 and the source signal line 3 as seen in a plan view, and the far end of the branch is used as the source electrode 11 of the light-emitting layer 16. Moreover, as will be described later, by laying the source signal line 3 and its branch, namely the source electrode 11, above the gate signal line 2 as seen spatially, and by forming the drain electrode 12 of the control TFT 6 simultaneously with and in structurally the same layer as the source electrode 11, it is possible, conveniently, to share the gate signal line 2 as the gate electrode 13 of the control TFT 6.

In the control TFT 6, the source electrode 11 and the drain electrode 12 are simply so arranged that one side of the former faces one side of the latter on the a-Si layer patch 13. By contrast, in the drive TFT 5, the source electrode 8 is so arranged as to surround the drain electrode 9. This results in an accordingly large channel width. Moreover, in this embodiment, in the drive TFT 5, the length over which the drain electrode 9 faces the source electrode 8 is three times the channel width of the control TFT 6 or more, and thus the channel width of the drive TFT 5 is six times the channel width of the control TFT 6 or more. By securing a large channel width in the drive TFT 5 in this way, it is in practice possible to realize optimum display even in a case where an a-Si TFT is used as the drive TFT. In this embodiment, the drive TFT 5 is formed as large as possible, with the result that the channel width of the drive TFT 5 is six times the channel width of the control TFT 6. It is, however, possible to obtain high-quality display by making the channel width of the drive TFT 5 equal to four times the channel width of the control TFT 6 or more. In this embodiment, the channel lengths of the control TFT 6 and the drive TFT 5 are made approximately equal. It is, however, possible to make the channel length of the drive TFT 5 smaller than the channel length of the control TFT 6 to make it accordingly easier for a current to pass through the former.

An insulating film 32 formed of SiNx is formed so as to cover the source signal line 3 and the TFTs 5 and 6, and on top of the insulating film 32 is laid a transparent electrode formed of ITO (indium tin oxide) or IZO (indium zinc oxide). This transparent electrode is patterned by photolithography to form the pixel electrode 14. This pixel electrode 14 is located within each pixel, has a substantially elliptic shape, is arranged along the source signal line 3, and has a portion thereof protruding so as to overlap a portion of the drain electrode 9a of the drive TFT 5. In this portion where the pixel electrode 14 overlaps the drain electrode 9a, a contact hole 23 is formed in the insulating film 32 above the drain electrode 9a, and the pixel electrode 14 is electrically connected to the drain electrode 9a via the contact hole 23.

When the pixel electrode 14 is formed, a patch of the transparent electrode is left between the power feed lines 4 and the source electrode 8a of the drive TFT 5 so that one of the power feed lines 4 and the source electrode 8a are electrically connected together. Specifically, above whichever of the power feed lines 4 corresponds to the pixel, a contact hole 18a is formed in the gate insulating film 31 and the insulating film 32 so that part of the power feed line 4 is exposed; above the source electrode 8a of the drive TFT 5, a contact hole 18b is formed in the insulating film 32 so that part of the source electrode 8a is exposed; and the transparent electrode patch 19 makes contact with the parts of the power feed line 4 and the source electrode 8a thus exposed via those contact holes 18a and 18b.

Another patch of the transparent electrode is left between the auxiliary electrode 134 and the gate electrode 10 of the drive TFT 5, and this transparent electrode patch 21 makes contact with parts of the auxiliary electrode 134 and the gate electrode 10 exposed via contact holes 20a and 20b, and thereby electrically connects those electrodes 10 and 134 together.

Figure 4:
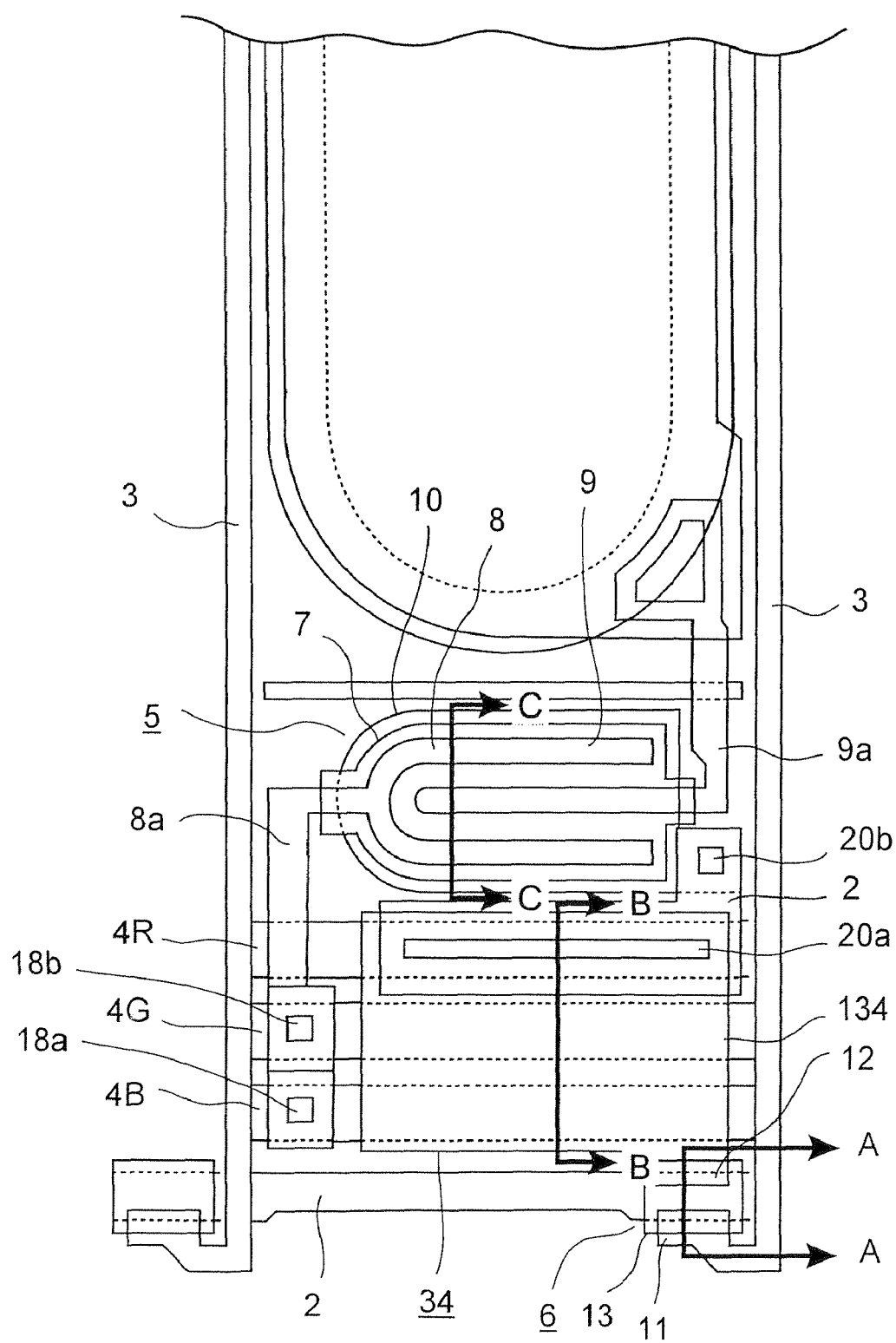
FIG. 4 is a plan view showing one of three, i.e., RGB, pixels.
Figure 5:
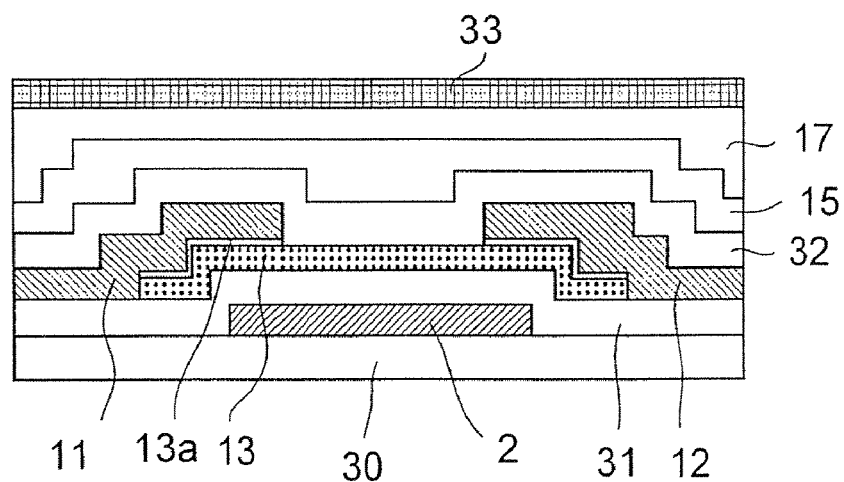
FIG. 5 is a schematic cross-sectional view showing the control TFT and a portion around it.

FIG. 4 is a plan view of one of the three pixels for the R, G, and B colors shown in FIG. 2, and now a description will be given of the cross sections of the layers taken in different portions of the pixel. FIG. 5 is a schematic cross-sectional view (taken along line A-A shown in FIG. 4) showing the control TFT 6 and a portion around it. First, on the glass substrate 30, which is common to the entire display device, the gate signal line 2 is formed. On top, the gate insulating film 31 formed of SiNx is formed, and thus the gate signal line 2 also is simultaneously covered by the gate insulating film 31. Further on top of the gate insulating film 31, the a-Si layer 13 is formed above the gate signal line 2 so as to lie over it. On top of the a-Si layer 13, the metal layer having layers of Al and Mo laid on one another is formed, with an N-type a-Si film 13a containing an N-type impurity laid in between. This metal layer is then patterned by photolithography to form the source signal line 3, the source electrode 11 diverging therefrom, and the drain electrode 12. Further on top are laid, one on top of another, the insulating film 32 formed of SiNx, a protection layer 15 formed of $SiO_2$ (silicon oxide), a bank layer 17, and the common electrode 33.

As described earlier, the three power feed lines 4 are formed so as to correspond to R, G, and B pixels, respectively. To minimize the narrowing, resulting from the provision of as many as three power feed lines 4, of the area that can be used for the organic EL element 1, the power feed lines 4 are laid parallel to the gate signal line 2, and they themselves are used to spatially form the holding capacitor 34 above them. This eliminates the need to form an extra holding capacitor line or to secure an extra flat area for the formation of the holding capacitor 34. Conventionally, the holding capacitor 34 is formed by laying a holding capacitor line in such a way that it, like the gate signal line 2 and the source signal line 3, runs through each pixel. In this embodiment, by contrast, there is no need to do so.

Now, the specific structure of the power feed lines 4 and the holding capacitor 34 will be described with reference to FIG. 6, which is a schematic cross-sectional view (taken along line B-B shown in FIG. 4) of the power feed lines and the holding capacitor and a portion around them. First, on top of the glass substrate 30, which is common to the entire display device, in the same layer as the gate signal line 2 shown in FIG. 5, the B power feed line 4B, the G power feed line 4G, and the R power feed line 4R are formed, which serve as one electrode of the holding capacitor 34. On top, the gate insulating film 31 formed of SiNx is formed, and thus the three power feed lines 4 also are simultaneously covered by the gate insulating film 31. Further on top of the gate insulating film 31, in the same layer as the source electrode 11 and the drain electrode 12 shown in FIG. 5, the metal layer having layers of Al and Mo laid on one another is formed, and this metal layer is patterned by photolithography so that the auxiliary electrode 134, i.e., the other electrode of the holding capacitor 34, is formed as an extension from the drain electrode 12. The power feed lines 4 and the holding capacitor 34 thus formed serve, more specifically, as individual holding capacitors 34a, 34b, and 34c (FIG. 1) necessary for pixels of the different colors.

The holding capacitor 34 has the auxiliary electrode 134 thereof connected to the gate electrode 10 (FIG. 2) of the drive TFT 5. Specifically, in the insulating film 32 above the auxiliary electrode 134 of the holding capacitor 34, the contact hole 20a is formed so that part of the auxiliary electrode 134 is exposed. Moreover, as shown in FIG. 2, the contact hole 20b also is formed in part of the gate insulating film 31 and the insulating film 32 so that part of the gate electrode 10 is exposed. Then, the transparent electrode 21 formed of ITO or IZO is formed to lie over the two contact holes 20a and 20b, and thus the auxiliary electrode 134 exposed via the contact hole 20a and the gate electrode 10 exposed via the contact hole 21b are electrically connected together via the transparent electrode 21. Further on top are laid, one on top of another, the protection layer 15, the bank layer 17, and the common electrode 33.

Figure 7:
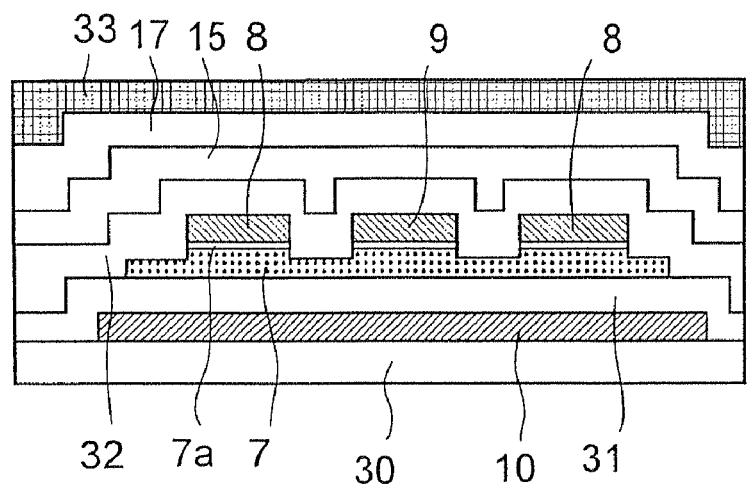
FIG. 7 is a schematic cross-sectional view showing the drive TFT and a portion around it.

The structure of the drive TFT 5 is shown in FIG. 7, which is a schematic cross-sectional view (taken along line C-C shown in FIG. 4) of the drive TFT and a portion around it. First, on the glass substrate 30, which is common to the entire display device, the gate electrode 10 is formed. On top, the gate insulating film 31 formed of SiNx is formed, and thus the gate electrode 10 also is simultaneously covered by the gate insulating film 31. Further on top of the gate insulating film 31, the a-Si layer patch 7 is laid as a semiconductor layer. On top of this a-Si layer patch 7, the metal layer having layers of Al and Mo laid on one another is formed, with an N-type a-Si thin film 7a containing an N-type impurity laid in between. This metal layer is then patterned by photolithography to form electrodes that will be used as the U-shaped source electrode 8 and the drain electrode 9. Further on top, the insulating film 32 formed of SiNx is formed.

With the elements and lines formed as described above, the organic EL element 1 is driven to emit light. Now, the structure of the organic EL element 1 will be described with reference to FIG. 3. Reference numeral 15 represents the protection film formed of $SiO_2$, which is formed on top of the insulating film 32 and overlaps an edge portion of the pixel electrode 14 of the organic EL element 1. That is, the protection layer 15 covers the edge portion of the pixel electrode 14, but is removed above the greater part, including a central portion, of the pixel electrode 14. Reference numeral 17 represents the bank layer formed on top of the protection layer 15 and formed of novolac resin, and this bank layer is formed thicker than the protection layer 15 or the insulating film 32. Organic EL as a light-emitting material is applied in the area surrounded by the bank layer 17, and therefore the bank layer 17 is so formed as to run along the outer edge of the pixel electrode 14 and surround the pixel electrode 14. For the sole purpose of keeping the light-emitting material in position, the bank layer 17 has only to be formed around the pixel electrode 14. In this embodiment, however, the bank layer 17 is formed also above the two TFTs 5 and 6 and the power feed lines 4. The bank layer 17 may be formed of any organic or inorganic resin other than novolac resin so long as it is an insulating material.

A light-emitting material corresponding to the color of each pixel is sprayed onto the pixel electrode 14 by ink jet so as to be held inside the area surrounded by the bank layer 17. This light-emitting material is organic EL, such as a conjugate high-polymer precursor. Thereafter, through heating, the light-emitting material is polymerized, so that R, G, and B light-emitting layers 16 are formed in individual pixels.

Reference numeral 33 represents the common electrode formed of Al or Cr, which is laid on top of the light-emitting layer 16. The common electrode 33 is formed over the entire display area, and is fed with a predetermined voltage. Forming the common electrode 33 as a metal layer permits the light-emitting layer 16 to emit light, and therefore the common electrode 33 may be formed of any metal other than Al or Cr. However, forming the common electrode 33 as a layer of a metal with a high light reflectivity such as Al or Cr as in this embodiment makes it possible to efficiently use the light from the light-emitting layer 16 for display and thereby achieve display with higher brightness. When a current higher than a threshold level is fed to the pixel electrode 14, the light-emitting layer 16 emits light, and this light can be observed from the side of the glass substrate 30.

For example, in a case where +8V (Vdd(R) and Vdd(G)) are fed to the R and G power feed lines 4, +10V (Vdd(B)) is fed to the B power feed line 4, and −3V is fed to the common electrode 33, when a scanning signal is fed to the gate signal line 2 and a data signal is fed to the source signal line 3, the scanned control TFT 6 turns on, and the data signal that flows through the source signal line 3 at that moment is fed through the drain electrode 12 of the control TFT 6 to the gate electrode 10 of the drive TFT 5. This turns the drive TFT 5 on. Thereafter, even when the control TFT 6 turns off, the holding capacitor 34 holds the drive TFT 5 on, and thus the current that flows through the corresponding power feed line 4 is fed through the drive TFT 5 to the pixel electrode 14. Thus, a potential difference greater than a predetermined level appears between the pixel electrode 14 and the common electrode 33, and thus a current flows through the light-emitting layer 16, resulting in emission of light of the color corresponding to the light-emitting material. Incidentally, in organic EL, a blue light-emitting material exhibits lower light emission efficiency than light-emitting materials of other colors, and therefore the pixel electrode 14 of a blue pixel is fed with a higher voltage than the pixel electrodes 14 of other pixels.

According to the present invention, the light-emitting layer 16 is formed in a longitudinally oblong shape and is arranged parallel to the source signal line 3, the drive TFT 5 is formed in a laterally oblong shape and is arranged parallel to the gate signal line 2. That is, the drive TFT 5 is arranged in such a way that the length direction of the drive TFT 5 is perpendicular to the length direction of the light-emitting layer 16. This arrangement permits to arrange, within the limited area surrounded by the source signal lines 3 and the gate signal lines 2, a large light-emitting layer 16 while making the drive TFT 5 as large as possible. In particular, it is possible to form the drive TFT 5 close to the source signal line 3, and thus to arrange the drive TFT 5 over the entire interval between adjacent source signal lines 3. This helps form the drive TFT 5 large. Thus, even when an a-Si TFT is used as the drive TFT 5, it is possible to feed a sufficient current to the light-emitting layer 16 and thereby obtain optimum display.

Here, the purpose of arranging the drive TFT 5 having a laterally oblong shape perpendicular to the light-emitting layer 16 having a longitudinally oblong shape is to permit the drive TFT 5 to pass a sufficient current, i.e., to increase the channel width. Accordingly, in the drive TFT 5, by forming the channel elongate and arranging it with the channel width direction perpendicular to the length direction of the light-emitting layer 16, it is possible to effectively increase the channel width within the limited area.

Moreover, according to the present invention, in the area surrounded by the gate signal lines 2 and the source signal lines 3, the light-emitting layer 16, the drive TFT 5, the three power feed lines 4, and the control TFT 6 are arranged in this order along the source signal line 3. This arrangement permits the individual elements to be arranged neatly, and also helps reduce the area needed for the arrangement of elements other than the light-emitting element and shorten the current path length from the power feed line to the light-emitting element. Moreover, by arranging the power feed lines 4 between the drive TFT 5 and the control TFT 6 so that the power feed lines 4 can be shared as the holding capacitor 34 for the drive TFT 5, it is possible to efficiently use the space within the pixel, and to arrange a plurality of power feed lines 4 corresponding to light-emitting layers 16 of different colors.

Figure 6:
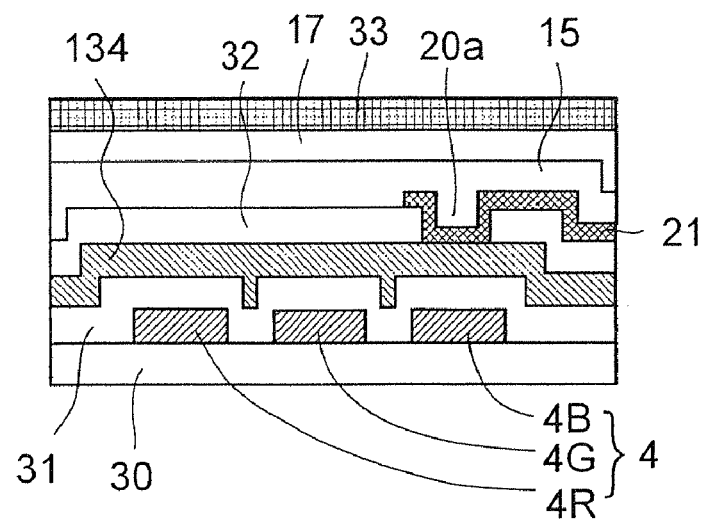
FIG. 6 is a schematic cross-sectional view showing the power feed line and the holding capacitor and a portion around it.

Composed of various layers laid one on top of another as described above, the pixel includes many near-transparent layers such as the gate insulating film 31, the insulating film 32, the transparent electrode 21, the protection layer 15, and the bank layer 17 shown in FIGS. 5 to 7 and the pixel electrode 14 shown in FIG. 3. Moreover, as will be understood from the description given thus far, as the result of the attempt to minimize the area for the arrangement of control elements and lines and to maximize the light-emitting area, the light-emitting layer 16 is located close to the light-emitting layer 16 of the next pixel, and the drive TFT 5 is located close to the light-emitting layer 16 within the pixel. In particular, the drive TFT 5 has a large channel width, and is arranged parallel to the light-emitting layer 16. This makes the light from the light-emitting layer 16 more likely to be incident on the semiconductor layer of the TFT. Light incident on the TFT causes light-induced leakage therein, making it impossible to feed a predetermined current to the light-emitting element.

This makes the actual display different from what is expected to be reproduced according to the display signal, and thus leads to lower display quality.

Figure 8A:
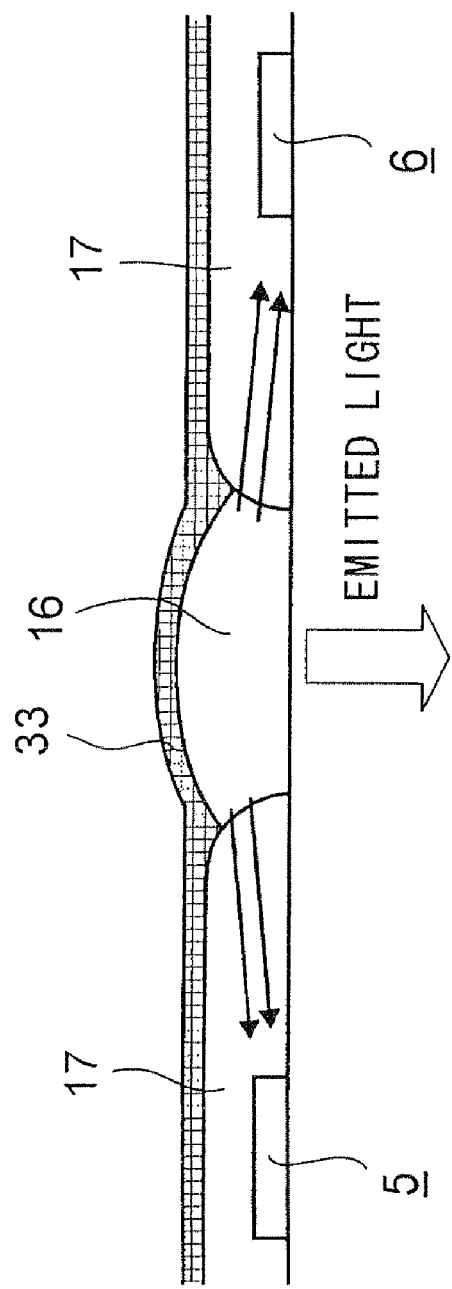
FIG. 8 is a diagram showing how light, when shielded and when not, is incident on the TFTs.
Figure 8B:
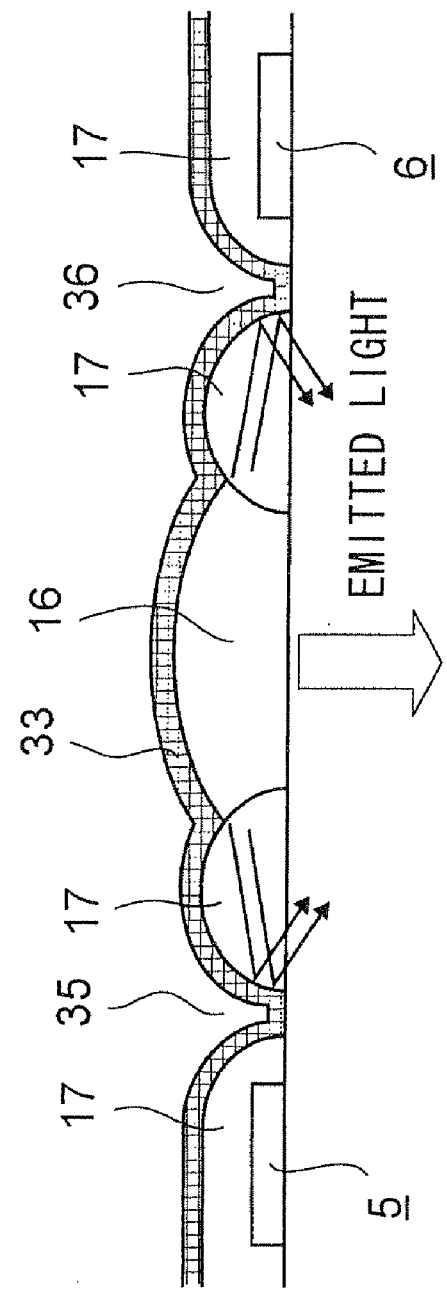

Now, with reference to FIG. 8, how the light from the light-emitting layer 16 is shielded will be described. FIG. 8(A) is a diagram showing how the light is incident on the TFT when the light is not shielded, and FIG. 8(B) is a diagram showing the path of the light when the light is shielded. For convenience' sake, in these figures, only the relevant layers are shown and the other layer are omitted. In FIG. 8(A), the light emitted from the light-emitting layer 16 covered by the common electrode 33 passes through the bank layer 17 and is incident on the unillustrated semiconductor active layer of the drive TFT 5. Here, some of the light is directly incident on the semiconductor active layer through the side face thereof, and some of the light is reflected from the common electrode 33 and is then incident on the semiconductor active layer through the top face thereof. Simultaneously, the light is incident also on the unillustrated semiconductor active layer of the control TFT 6. In particular, as will be understood from its use as a light semiconductor, a-Si is liable to be affected by light, and produces a large leak current when light is incident thereon.

To avoid this, as shown in FIG. 8(B), a cut 35 is formed in the bank layer 17 between the light-emitting layer 16 and the drive TFT 5. A similar cut 36 is formed also in the bank layer between the light-emitting layer 16 and the control TFT 6. Thereafter, the common electrode 33 is formed from above so as to cover them. As described earlier, the common electrode 33 is a layer of a metal such as Al or Cr that reflects light, and the inner surface of the common electrode 33 formed so as to cover the cuts 35 and 36 reflects light and thereby prevents it from being incident on the TFTs.

Here, advisably, the inner surface of the common electrode 33 at the cuts 35 and 36 is so shaped as to reflect light in the direction pointing to the bottom of the figure, i.e., toward the unillustrated glass substrate. This helps increase the apparent brightness of the display when it is observed from the side of the glass substrate. The cuts 35 and 36 are shaped, advisably, as follows. The light-emitting layer side contours of the cuts 35 and 36 run along the contour of the light-emitting layer 16. This makes it possible to efficiently use the light from the light-emitting layer 16 for display. The TFT side contours of the cuts 35 and 36 is located as close as possible to the TFTs. This makes it possible to surely prevent incidence of light on the TFTs.

As shown in FIG. 2, whereas the cut 35 located between the light-emitting layer 16 and the drive TFT 5 is formed in a rectilinear shape in the direction of the width of the pixel, the cut 36 located between the light-emitting layer 16 and the control TFT 6 is so shaped as to run roughly along the width-direction outer edge of the light-emitting layer 16. That is, since the drive TFT 5 is an a-Si TFT, it is formed large over the entire width of the pixel so as to be capable of feeding a sufficient current to the pixel electrode 14, and, to prevent incidence of light on this drive TFT 5, the cut 35 is formed long along the drive TFT 5. On the other hand, since the control TFT 6 is formed at the intersection between the gate signal line 2 and the source signal line 3, the cut 36 is formed at least near the intersection between the two signal lines 2 and 3. The cut 36 is formed also between adjacent intersections between the gate signal line 2 and the source signal line 3. This helps surely prevent incidence of light on the control TFT 6, and also helps direct the light from the light-emitting layer 16 to a lower portion of the display area. In this way, it is possible to shield unnecessary light from the light-emitting layer 16 in such a manner as to enclose the light source, and simultaneously to permit the light reflected from the cut 36 to be mixed with the light traveling from the light-emitting layer 16 along the direct path, resulting in still higher brightness.

The light from the light-emitting layer 16 not only exerts its effect within a given pixel but may also affect the drive TFT of the next pixel. Out of this consideration, and from the viewpoint of increasing the reflection efficiency at the cuts, the cuts 35 and 36 are advisably so formed as to have as close a length as possible to the length of the shorter sides of the pixel.

On top of the bank layer 17 that covers the TFTs 5 and 6 is laid the common electrode 33. That is, the TFTs 5 and 6 are covered by the light-shielding common electrode 33 from above. This prevents incidence of light on the TFTs 5 and 6 from above. Incidentally, in a case where the TFTs 5 and 6 are covered by an electrically conductive member such as the common electrode 33 from above, the bank layer 17 serves also to increase the distance from the TFTs 5 and 6 to the common electrode 33. Since a predetermined voltage is always applied to the common electrode 33, if the common electrode 33 is arranged near the TFTs 5 and 6, it adversely affects the operation of the TFTs 5 and 6. Therefore, it is advisable to arrange the TFTs 5 and 6 as far away as possible from the common electrode 33, and it is possible to secure a sufficient distance there by giving a greater film thickness to the bank layer 17 covering the TFTs 5 and 6. Accordingly, even in a case where no bank layer 17 is formed around the light-emitting element, forming a bank layer 17 above the TFTs 5 and 6 and laying the common electrode 33 above the bank layer 17 helps prevent incidence of light on the TFTs 5 and 6. Thus, forming the bank layer 17 above the TFTs 5 and 6 is effective. In this case, by forming the bank layer 17 in such a way that its edge is located between the light-emitting element and the TFTs 5 and 6, it is possible to omit the cuts 35 and 36.

In this embodiment, the light-shielding film that is laid above the cuts in the bank layer and above the TFTs is formed by the common electrode. This eliminates the need to form a light-shielding film separately from the common electrode, and thus helps simplify the fabrication process. However, according to the invention, the light-shielding film does not necessarily have to be formed by the common electrode, but may be formed by forming a black resin film on the bank layer covering the TFTs.

As described above, the present invention aims at forming an a-Si TFT as a TFT for feeding a current to an organic EL element. This eliminates the need to fabricate a polysilicon TFT, and thus helps simplify the fabrication process and thereby produce an inexpensive display device. It is to be understood that the present invention can be implemented in any other manner than specifically described above within the scope of its concept. For example, although the embodiment described above assumes the use of a drive TFT 5 provided with a drain electrode 9 in a rectilinear shape and a source electrode 8 in a U shape enclosing the drain electrode 9 so as to have an elongate channel region along both sides of the drain electrode 9, the drive TFT 5 may be formed in any other manner so long as it can feed a sufficient current to the organic EL element; for example, it is possible to use one provided with a source and a drain electrode both in a laterally oblong shape and having those source and drain electrodes so arranged that the direction of the channel width is perpendicular to the length direction of the light-emitting layer 16. The source and drain electrodes of the drive TFT 5 may be given any other shapes; for example, it is possible to form the source electrode in a C shape and the drain electrode in a rectilinear shape, or the drain electrode in a U shape and the source electrode in a rectilinear shape.

According to the present invention, the TFT that feeds a current to the organic EL element is formed as an n-channel a-Si TFT. It is, however, also possible to use instead a p-channel a-Si TFT. Forming the TFT with the same type of channel helps simplify the fabrication process and thereby produce an inexpensive display device.

INDUSTRIAL APPLICABILITY

According to the present invention, in a display device having a plurality of pixels arrayed so as to form a matrix-like pattern, the display device comprises a light-emitting element that is formed in each pixel, a drive TFT that is formed in each pixel and that feeds a current to the light-emitting element to make the light-emitting element emit light, and a control TFT that controls the operation of the drive TFT. Here, the drive TFT and the control TFT have a semiconductor layer formed of a-Si. This makes it possible to fabricate large-area TFTs with uniform characteristics without the need for sophisticated fabrication technology or expensive fabrication equipment. Thus, it is possible to provide a self-illuminating display device that is inexpensive and that is suited for large-screen applications.

When an a-Si TFT is used, a drive TFT needs to be formed as large as possible so as to be able to feed a sufficient current to a light-emitting element. By forming the light-emitting element in a longitudinally oblong shape, forming the drive TFT in a laterally oblong shape, arranging the drive TFT so that its length direction is perpendicular to the length direction of the light-emitting element, and arranging the light-emitting element, the drive TFT, a power feed line, and a control TFT in this order along a source signal line, it is possible to efficiently arrange the individual elements in the limited space within a pixel. This makes it possible to secure a large area for the arrangement of the light-emitting element and simultaneously make the drive TFT large, and thus helps obtain a display device that offers satisfactory display quality.

By forming the channel region of the drive TFT elongate, forming one of the source and drain electrodes thereof in a substantially rectilinear shape, and forming the other in a shape surrounding the one, it is possible to increase the channel width of the drive TFT. This makes it possible to supply a sufficient current to the light-emitting element even in a case where an a-Si TFT is used.

By forming a holding capacitor between the drive TFT and the control TFT, sharing the power feed line as one electrode of the holding capacitor, and forming the other electrode thereof with an auxiliary electrode that connects to the drain electrode of the control TFT and to the gate electrode of the drive TFT, it is possible to compactly arrange the individual elements without the need for a dedicated capacitance line. This helps enlarge the area that can be secured for the light-emitting element, and thus contributes to increased light emission efficiency and brightness.

By forming a plurality of power feed lines corresponding respectively to light-emitting elements emitting light of different colors, arranging the plurality of power feed lines between the drive thin-film transistor and the control thin-film transistor, and feeding the light-emitting elements with currents from the corresponding power feed lines, it is possible to feed the light-emitting elements for the different colors, which have different light emission efficiency from one another, with appropriate currents and thereby achieve optimum full-color display.

Using a gate signal line as the gate electrode of the control TFT, and forming the control TFT above the gate signal line, it is possible to eliminate the need to separately form a gate electrode. This eliminates the need to secure an extra area for the formation of the control TFT, and thus helps secure a large space for the arrangement of the drive TFT.

Forming a bank area around the light-emitting element so that the bank area overlaps the drive TFT and the control TFT, forming a cut in the bank layer between the light-emitting element and the drive TFT and between the light-emitting element and the control TFT provided in the next pixel, and laying a light-shielding film on the bank layer at least in a portion thereof near the cut, it is possible to reduce light-induced leakage resulting from the light form the light-emitting layer being incident on the semiconductor layers of those TFTs and thereby provide a display device with high display quality.

Forming the drive TFT and the control TFT as a-Si TFTs of either a p-channel type or an n-channel type, it is possible to simplify the fabrication process, to eliminate the need for complicated fabrication equipment, and to increase the yield rate and simultaneously reduce the cost.

The invention claimed is:

1. A display device having a plurality of pixels arrayed so as to form a matrix-like pattern, the display device comprising:

an organic electroluminescence element that is formed in a longitudinally oblong shape in each pixel;

a drive thin-film transistor that is formed in each pixel and that feeds a current to the organic electroluminescence element to make the organic electroluminescence element emit light; and a control thin-film transistor that controls operation of the drive thin-film transistor, wherein the drive thin-film transistor is formed in a laterally oblong shape, a gate signal line and a source signal line connected to the control thin-film transistor are arranged in a matrix-like pattern, the organic electroluminescence element is arranged so that a longer-side direction thereof is parallel to the source signal line, the drive thin-film transistor has a channel region formed in an elongate shape, the channel region being arranged so that a longer-side direction thereof is parallel to the gate signal line and to shorter sides of the organic electroluminescence element, and being disposed over a substantially entire area of each pixel along the gate signal line, and the drive thin-film transistor and the control thin-film transistor have a semiconductor layer formed of non-crystal silicon.

2. A display device as claimed in claim 1, wherein the drive thin-film transistor and the control thin-film transistor are formed of amorphous silicon.

3. A display device as claimed in claim 1, wherein of a source electrode and a drain electrode of the drive thin-film transistor, one is formed in a rectilinear shape and the other is formed in a shape surrounding the one.

4. A display device as claimed in claim 1, wherein the drive thin-film transistor has a U-shaped source electrode and a drain electrode located between two fork-like portions of the U-shaped source electrode.

5. A display device as claimed in claim 1, wherein for each row of the matrix-like pattern, a gate signal line is connected to gate electrodes of all control thin-film transistors in pixels located in the row, and a power feed line is provided for feeding a current via the drive thin-film transistors to the organic electroluminescence elements in the row, for each column of the matrix-like pattern is formed a source signal line that is connected to source electrodes of all control thin-film transistors in pixels located in the column and that crosses the gate signal line, and within each area surrounded by gate signal lines and source signal lines, the organic electroluminescence element, the drive thin-film transistor, the power feed line, and the control thin-film transistor are arranged in this order along the source signal line as seen in a plan view.

6. A display device as claimed in claim 5, wherein between the drive thin-film transistor and the control thin-film transistor is formed a holding capacitor of which one electrode is shared as the power feed line and of which the other electrode is formed by an auxiliary electrode that connects to the drain electrode of the control thin-film transistor, and the auxiliary electrode is electrically connected to the gate electrode of the drive thin-film transistor.

7. A display device as claimed in claim 5, wherein the display device comprises organic electroluminescence elements that emit light of different colors, a plurality of power feed lines are formed so as to correspond to light of the different colors, the plurality of power feed lines are arranged between the drive thin-film transistor and the control thin-film transistor within a same pixel, and the organic electroluminescence elements are fed with a current from the corresponding power feed lines.

8. A display device as claimed in claim 5, wherein the gate signal line is used as the gate electrode of the control thin-film transistor, and the control thin-film transistor is formed above the gate signal line.

9. A display device as claimed in claim 1, wherein a bank layer is arranged around the organic electroluminescence element, the bank layer is formed so as to overlap the drive thin-film transistor, a cut is formed in the bank layer between the organic electroluminescence element and the drive thin-film transistor, and a light-shielding film is formed on the bank layer at least in a portion thereof near the cut.

10. A display device as claimed in claim 1, wherein a bank layer is arranged around the organic electroluminescence element, the bank layer is formed so as to overlap the control thin-film transistor, a cut is formed in the bank layer between the organic electroluminescence element and the control thin-film transistor formed in a next pixel, and a light-shielding film is formed on the bank layer so as to cover the bank layer and the cut.

11. A display device as claimed in claim 1, wherein a bank layer is formed so as to cover the drive thin-film transistor and the control thin-film transistor, the bank layer has edges thereof located between the drive and control thin-film transistors and the organic electroluminescence element, and a light-shielding film is formed on the bank layer.

12. A display device as claimed in any one of claims 9-11, wherein the display device further comprises:

a pixel electrode that is arranged below a light-emitting layer of the organic electroluminescence element and that connects to the drive thin-film transistor; and a common electrode that is arranged so as to face the pixel electrode with the organic electroluminescence element interposed in between and that covers the bank layer, and the light-shielding film is formed by the common electrode.

13. A display device as claimed in any one of claims 1-11, wherein the drive thin-film transistor and the control thin-film transistor are of an n-channel type.

14. A display device as claimed in any one of claims 1-11, wherein the drive thin-film transistor and the control thin-film transistor are of a p-channel type.

15. A display device as claimed in any one of claims 1-11, wherein a channel width of the drive thin-film transistor is equal to or more than three times the channel width of the control thin-film transistor.

\* \* \* \* \*